(12) United States Patent
Hsu

(10) Patent No.: US 7,718,470 B2
(45) Date of Patent: May 18, 2010

(54) PACKAGE SUBSTRATE AND METHOD FOR FABRICATING THE SAME

(75) Inventor: Shih-Ping Hsu, Hsin-Chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 219 days.

(21) Appl. No.: 11/874,112

(22) Filed: Oct. 17, 2007

(65) Prior Publication Data

US 2009/0096099 A1    Apr. 16, 2009

(51) Int. Cl.
*H01L 21/00* (2006.01)
(52) U.S. Cl. .................. 438/106; 438/614; 438/671; 257/700; 257/E21.597
(58) Field of Classification Search .............. 438/106, 438/108, 125, 612–614, 618, 671; 257/700, 257/777, 778, E21.597, E23.01
See application file for complete search history.

(56) References Cited

U.S. PATENT DOCUMENTS 6,576,540 B2 *   6/2003  Chen et al. .................. 438/612
7,045,460 B1 *   5/2006  Weng et al. ................. 438/671
7,419,897 B2 *   9/2008  Shih ........................... 438/613
2004/0099961 A1 * 5/2004  Chu et al. ................... 257/781
2007/0218591 A1 * 9/2007  Chou .......................... 438/125

* cited by examiner

*Primary Examiner*—Ha Tran T Nguyen
*Assistant Examiner*—Daniel Whalen
(74) *Attorney, Agent, or Firm*—Sawyer Law Group, P.C.

(57) ABSTRACT

A package substrate and a method for fabricating the same are provided according to the present invention. The package substrate includes: a substrate body with a die attaching side and a ball implanting side lying opposite each other, having a plurality of wire bonding pads and a plurality of solder ball pads respectively, and having a first insulating passivation layer and a second insulating passivation layer respectively, wherein a plurality of first apertures and a plurality of second apertures are formed in the first insulating passivation layer and the second insulation passivation layer respectively to corresponding expose the wire bonding pads and the solder ball pads; a chemical plating metal layer formed on the wire bonding pads and solder ball pads respectively; and a wire bonding metal layer formed on a surface of the chemical plating metal layer of the wire bonding metal layer.

6 Claims, 13 Drawing Sheets

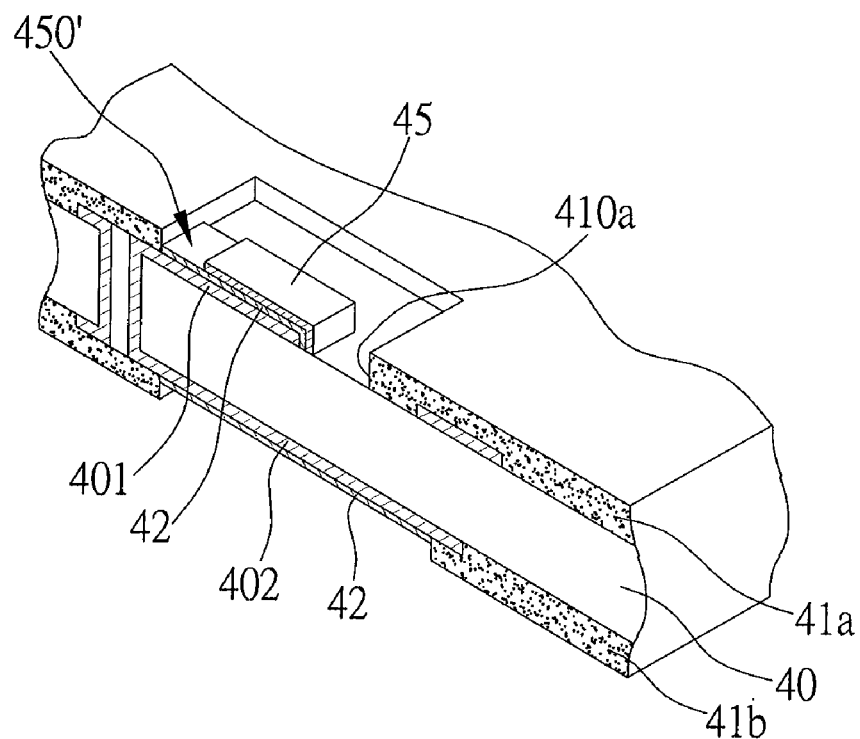
FIG. 5E'
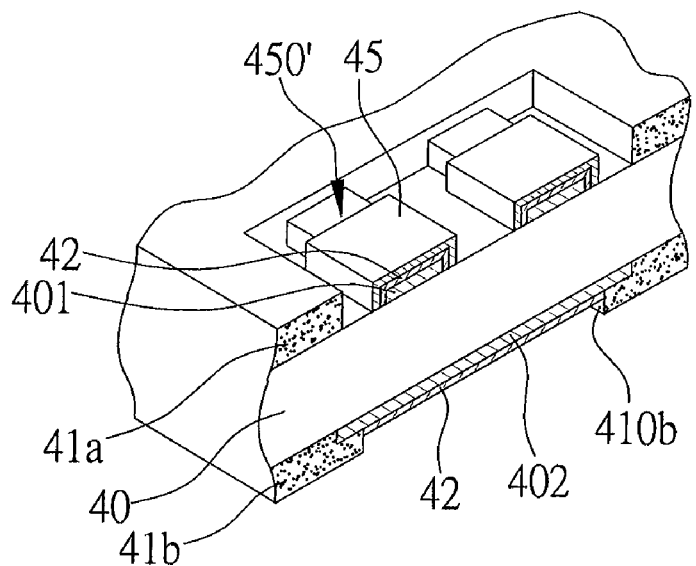
FIG. 5E"

20, and form a plurality of wire bonding pads 201 on at least one surface of the substrate body 20, and then form an insulating passivation layer 21 on the substrate body 20 and the wire bonding pads 201, and subsequently form a plurality of apertures of insulating passivation layer 210 in the insulating passivation layer 21 to correspondingly expose each of the wire bonding pads 201 and part surface of the substrate body 20; next, as shown in FIG. 2B, form a wire bonding metal layer 22 on the wire bonding pads by means of chemical deposition.

PACKAGE SUBSTRATE AND METHOD FOR FABRICATING THE SAME

BACKGROUND OF THE INVENTION

1. Field of the Invention

The present invention generally relates to package substrates and methods for fabricating the same, and more specifically, to a package substrate with a wire bonding metal layer formed on wire bonding pads and a method for fabricating the same.

2. Description of Related Art

Owing to the flourishing development of the electronics industry, the research and development of electronic products have a trend toward multi-function, high-performance products. To satisfy the packaging requirements of high integration and miniaturization for semiconductor packages, package substrates for carrying semiconductor chips have been evolving from single-layer into multi-layer boards. Therefore, given a limited space, circuit area available to a package substrate is expandable by interlayer connection technology in order to cope with the application demands for high-density integrated circuits.

At present, package substrates for carrying semiconductor chips include wire bond package substrates, chip scale package (CSP) substrates, flip chip ball grid array (FCBGA) substrates, and others. To meet the operational requirements for microprocessors, chipsets, and graphic chips, improvements have to be made in delivery of chip signals, bandwidth, impedance control, etc. of circuit-laden circuit boards with a view to answering to the development trends of high I/O number packages. However, to fit in with the developing trend of semiconductor package towards light weight, small size, multi functions, high speed, and high frequency, circuit boards for packaging semiconductor chips have been trending towards fine lines and small apertures; size of circuit lines of circuit board, including line width, spaces between lines, aspect ratio, etc., has been reduced from the traditional 100 μm to below 25 μm presently, and the development trend is continuously towards smaller lines with great precision.

Please refer to FIGS. 1A and 1B, which are cross-sectional views of a fabrication method of a known package substrate that has wire bonding metal layer formed on its wire bonding pads; wherein as shown in FIG. 1A, provide first a substrate body 10, and then form a plurality of wire bonding pads 101 on at least a surface of the substrate body 10, and the wire bonding pads 101 have plating lines 102, also form an insulating passivation layer 11 on the substrate body 10 and the wire bonding pads 101, and then form a plurality of apertures of insulating passivation layer 110 in the insulating passivation layer 11 to correspondingly expose each of the wire bonding pads 101 and part surface of the substrate body 10; as shown in FIG. 1B, form a wire bonding metal layer 12 of, e.g. nickel/gold (Ni/Au), on the wire bonding pads 101 by using the plating lines 102 as an electrical conduction path.

However, the wire bonding metal layer 12 is formed on the wire bonding pads 101 by means of electroplating via the plating lines 102; and since the plating lines 102 must be laid on the substrate body 10, a great deal of area of the substrate body 10 is taken, thereby being unable to reach objectives of high density wiring and fine spacing between wire bonding pads.

Please refer to FIGS. 2A and 2B, which are cross-sectional views of another fabrication method of a known package substrate that has wire bonding metal layer formed on its wire bonding pads; as shown in FIG. 2A, provide a substrate body As stated above, chemical deposition is applicable to forming wire bonding metal layer 22 on the wire bonding pads 201, however, a sufficient thickness of wire bonding metal layer 22 costs highly, also wire bonding metal layer 22 formed by means of chemical deposition has softer texture and has poor bonding capability with wire of subsequent wire bonding process, thereby being disadvantageous to application demands of high number of pins.

Please refer to FIGS. 3A through 3H, which are cross-sectional views illustrating a fabrication method of wire bonding metal layer formed on wire bonding pads by means of non plating lines (NPL) electroplating; wherein a substrate body 30 with a plurality of wire bonding pads 301 thereon is provided, and as shown in FIG. 3B, form an electroconductive layer 32 on the wire bonding pad 301 and part surface of the substrate body 30; as shown in FIG. 3C, form a first photoresist layer 33a on the electroconductive layer 32, and also form a plurality of first openings 330a in the first photoresist layer 33a to correspondingly expose the electroconductive layer 32 on area of each of the wire bonding pads 301; as shown in FIG. 3D, remove the electroconductive layer 32 inside the first openings 330a; as shown in FIG. 3E, form a second photoresist layer 33b on the first photoresist layer 33a and inside the first openings 330a, and then form a plurality of second openings 330b in the second photoresist layer 33b to expose each of the wire bonding pads 301 but cover the electroconductive layer 32 not covered by the first photoresist layer 33a inside the first openings 330a; since the electroconductive layer 32 is electrically connecting to the wire bonding pads 301, as shown in FIG. 3F, a wire bonding metal layer 34 is formed on the wire bonding pads 301 inside the second openings 330b by electroplating via the electroconductive layer 32; as shown in FIG. 3G, remove the second photoresist layer 33b, the first photoresist layer 33a, and the electroconductive layer 32 covered thereunder to expose the wire bonding pads 301 and the wire bonding metal layer 34 there above; and as shown in FIG. 3H, form an insulating passivation layer 35 on the substrate body 30 and the wire bonding metal layer 34, and then form a plurality of apertures of insulating passivation layer 350 to expose the wire bonding metal layer 34 on the wire bonding pads 301.

According to the abovementioned NPL method, sufficient thickness of wire bonding metal layer 34 can be obtained by electroplating and has cost lower than by chemical deposition, and the wire bonding metal layer 34 formed by electroplating has firmer texture, thereby having better bonding capability with wire of subsequent wire bonding process. However, the fabrication method is complicated and the cost is still high. Besides, the insulating passivation layer 35, which is formed after the wire bonding metal layer 34 has been formed, causes contamination to the wire bonding metal layer 34 readily, thereby resulting in unstable quality of the subsequent wire bonding.

Hence, it is a highly urgent issue in the industry for how to provide a package substrate that has wire bonding metal layer formed on its wire bonding pads and a method for fabricating the same, which are capable of providing high density wiring and fine spacing between wire bonding pads as well as enhancing bonding capability and being advantageous to application demands of high number of pins.

SUMMARY OF THE INVENTION

In view of the disadvantages of the prior art mentioned above, it is a primary objective of the present invention to provide a package substrate and a method for fabricating the same, which are capable of providing high density wiring and fine spacing between wire bonding pads.

It is another object of the present invention to provide a package substrate and a method for fabricating the same, which are capable of enhancing bonding capability with wire of wire bonding process and being advantageous to application demands of high number of pins.

To achieve the aforementioned and other objectives, a package substrate is provided according to the present invention; the package substrate comprises: a substrate body having a die attaching side and a ball implanting side opposite to the die attaching side, wherein the die attaching side is formed with a plurality of wire bonding pads, and is covered with a first insulating passivation layer being formed with a plurality of first apertures for exposing the wire bonding pads, and wherein the ball implanting side is formed with a plurality of solder ball pads and is covered with a second insulating passivation layer being formed with a plurality of second apertures for exposing the solder ball pads; a chemical plating metal layer formed on the wire bonding pads and the solder ball pads respectively; and a wire bonding metal layer formed on the chemical plating metal layer on the wire bonding pads.

According to the foresaid package substrate, the chemical plating metal layer is made of either nickel/gold (Ni/Au) or nickel/palladium/gold (Ni/Pd/Au), and the gold is formed outermost; the wire bonding metal layer is made of either plating metal or gold (Au).

A fabrication method of package substrate is further provided according to the present invention; the method comprises: a substrate body having a die attaching side and a ball implanting side opposite to the die attaching side, wherein the die attaching side is formed with a plurality of wire bonding pads, and is covered with a first insulating passivation layer being formed with a plurality of first apertures for exposing the wire bonding pads, and wherein the ball implanting side is formed with a plurality of solder ball pads and is covered with a second insulating passivation layer being formed with a plurality of second apertures for exposing the solder ball pads; forming a chemical plating metal layer on the wire bonding pads and the solder ball pads respectively; forming a first conductive layer on the first insulating passivation layer and the chemical plating metal layer on the wire bonding pads; forming a first photoresist layer on the first conductive layer, and forming a plurality of first openings in the first photoresist layer to expose the first conductive layer corresponding in position to the wire bonding pads situated therebetween, wherein the first openings are larger in diameter than the first apertures, and the first photoresist layer has an extension formed on each of the wire bonding pads inside each of the first openings to cover a part of the first conductive layer; removing the first conductive layer inside the first openings to expose the chemical plating metal layer on the wire bonding pads; forming a wire bonding metal layer on the chemical plating metal layer on the wire bonding pads by electroplating; and removing the first photoresist layer and the first conductive layer thereunder to expose the first insulating passivation layer and the wire bonding metal layer on the wire bonding pads inside the first apertures.

According to the aforesaid fabrication method, the chemical plating metal layer is made of either nickel/gold (Ni/Au) or nickel/palladium/gold (Ni/Pd/Au), and the gold is formed outermost; the first conductive layer is formed by means of either chemical deposition or physical deposition, and the first conductive layer is made of copper (Cu); and the wire bonding metal is made of gold (Au).

The aforesaid fabrication method further comprises: forming a second conductive layer on the second insulating passivation layer and the chemical plating metal layer of the solder ball pads.

Another fabrication method of package substrate is further provided by the present invention, the fabrication method comprises: providing a substrate body having a die attaching side and a ball implanting side opposite to the die attaching side, wherein the die attaching side is formed with a plurality of wire bonding pads, and is covered with a first insulating passivation layer being formed with a plurality of first apertures for exposing the wire bonding pads, and wherein the ball implanting side is formed with a plurality of solder ball pads and is covered with a second insulating passivation layer being formed with a plurality of second apertures for exposing the solder ball pads; forming a chemical plating metal layer on the wire bonding pads and the solder ball pads respectively; forming a first conductive layer on the first insulating passivation layer and the chemical plating metal layer on the wire bonding pads; forming a first photoresist layer on the first conductive layer, and forming a plurality of first openings in the first photoresist layer to expose the first conductive layer corresponding in position to the wire bonding pads situated therebetween, wherein the first openings are larger in diameter than the first apertures, and the first photoresist layer has an extension formed on each of the wire bonding pads inside each of the first openings to cover a part of the first conductive layer; removing the first conductive layer inside the first openings to expose the chemical plating metal layer on the wire bonding pads; forming a wire bonding metal layer on the chemical plating metal layer on the wire bonding pads by electroplating; and removing the first photoresist layer and the first conductive layer under the photoresist layer so as to expose the first insulating passivation layer and the wire bonding metal layer on the wire bonding pads inside the first apertures.

According to the aforesaid fabrication method, the chemical plating metal layer is made of either nickel/gold (Ni/Au) or nickel/palladium/gold (Ni/Pd/Au), and the gold is formed outermost; the wire bonding metal layer is made of gold (Au).

According to the aforesaid fabrication method, further comprises: form a second conductive layer on the second insulating passivation layer and the chemical plating metal layer of the solder ball pads.

A further fabrication method of package substrate is provided by the present invention, the fabrication method comprises: a substrate body having a die attaching side and a ball implanting side opposite to the die attaching side, wherein the die attaching side is formed with a plurality of wire bonding pads, and is covered with a first insulating passivation layer being formed with a plurality of first apertures for exposing the wire bonding pads, and wherein the ball implanting side is formed with a plurality of solder ball pads and is covered with a second insulating passivation layer being formed with a plurality of second apertures for exposing the solder ball pads; forming a chemical plating metal layer on the wire bonding pads and the solder ball pads respectively; forming a first conductive layer on the first insulating passivation layer and the chemical plating metal layer on the wire bonding pads; forming a first photoresist layer on the first conductive layer, and forming a plurality of first openings in the first photoresist layer to expose the first conductive layer corresponding in position to the wire bonding pads, wherein the first openings are smaller in diameter than the first apertures so that a part of the first conductive layer on the wire bonding pads is covered by the first photoresist layer; removing the first conductive layer exposed from the first openings to expose the chemical plating metal layer on the wire bonding pads; forming a third photoresist layer on the first photoresist layer, and forming in the third photoresist layer a plurality of third openings smaller in diameter than the first openings so as to expose the chemical plating metal layer on the wire bonding pads; forming a wire bonding metal layer on the chemical plating metal layer on the wire bonding pads by electroplating; and removing the third photoresist layer, the first photoresist layer, and the first conductive layer under the first photoresist layer so as to expose the first insulation passivation layer and the wire bonding metal layer on the wire bonding pads inside the first apertures.

According to the foresaid fabrication method, the chemical plating metal layer is made of either nickel/gold (Ni/Au) or nickel/palladium/gold (Ni/Pd/Au), and the gold is formed outermost; the wire bonding metal layer is made of gold (Au).

The package substrate and a method for fabricating the same of the present invention mainly have a first insulating passivation layer and a second insulating passivation layer formed on the die attaching side and the ball implanting side of the substrate body respectively, and then sequentially form a chemical plating metal layer and wire bonding metal layer of plating gold on the wire bonding pads, therefore, the wire bonding pads have thicker gold layer thereon than the solder ball pads that has gold from chemical plating metal layer only; beside, plating gold has firmer texture than chemical plating gold, thereby enhancing bonding capability with wires of subsequent wire bonding process; accordingly, the first two fabrication method of the present invention avoid wiring process of plating lines and thus provide application demands of high density wiring and fine spacing.

BRIEF DESCRIPTION OF DRAWINGS

The present invention can be more fully understood by reading the following detailed description of the preferred embodiments, with reference made to the accompanying drawings, wherein:

FIG. 4C' is a cross-sectional view of another embodiment corresponding to FIG. 4C;

FIG. 4D' is a perspective cross-sectional view in accordance with FIG. 4D;

FIGS. 4G' and 4G" are perspective cross-sectional views of FIG. 4G at different angles;

FIG. 5A' is a cross-sectional view of another embodiment corresponding to FIG. 5A;

FIG. 5C' is a perspective sectional view in accordance with FIG. 5C;

FIGS. 5E' and 5E" are perspective cross-sectional views in accordance with FIG. 5E.

DETAILED DESCRIPTION OF PREFERRED EMBODIMENTS

The following illustrative embodiments are provided to illustrate the disclosure of the present invention, these and other advantages and effects can be apparently understood by persons skilled in the art after reading the disclosure of this specification. The present invention can also be performed or applied by other different embodiments. The details of the specification may be on the basis of different points and applications, and numerous modifications and variations can be devised without departing from the spirit of the present invention.

First Embodiment

Please refer to FIGS. 4A through 4G, which are cross-sectional views illustrating the first embodiment of fabrication method of package substrate of the present invention.

Figure 1A:
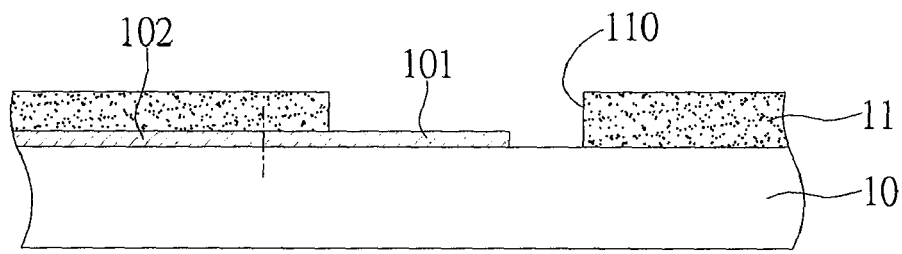
FIGS. 1A and 1B are cross-sectional views of a known fabrication method of package substrate with a wire bonding metal layer formed on wire bonding pads by means of electroplating via plating lines.
Figure 1B:
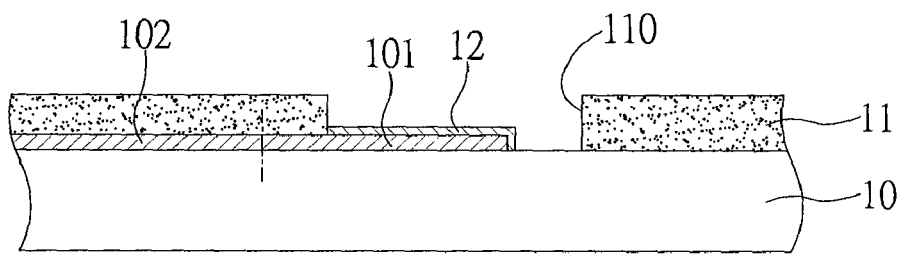
Figure 2A:
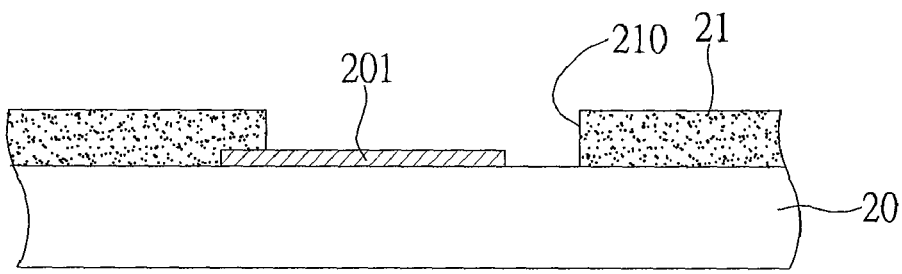
FIGS. 2A and 2B are cross-sectional views of another known fabrication method of package substrate with a wire bonding metal layer formed on wire bonding pads by means of chemical deposition.
Figure 2B:
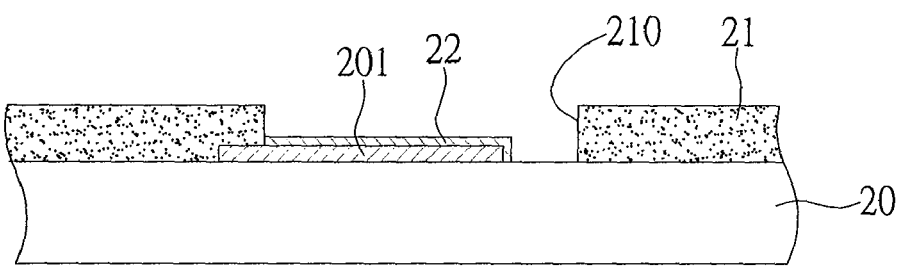
Figure 3A:
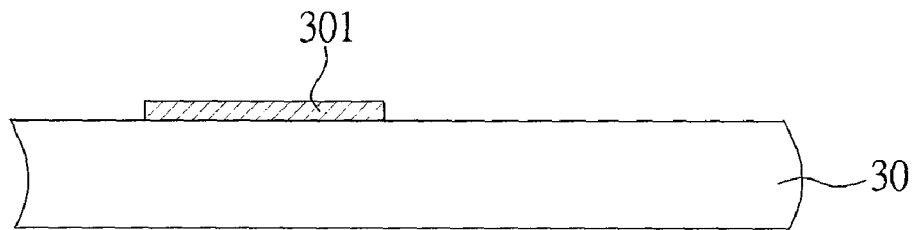
FIGS. 3A through 3H are cross-sectional views of a known fabrication method of package substrate with a wire bonding metal layer formed on wire bonding pads by means of non plating lines (NPL) electroplating.
Figure 3B:
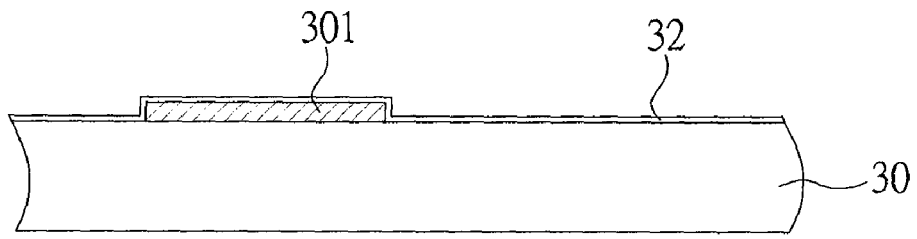
Figure 3C:
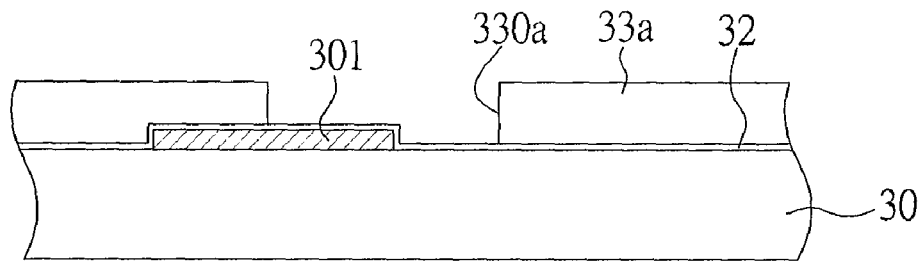
Figure 3D:
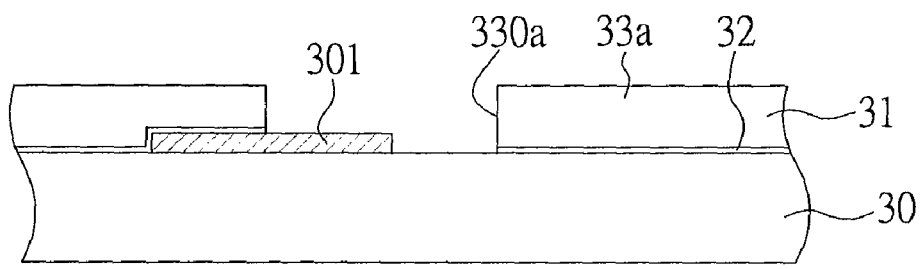
Figure 3E:
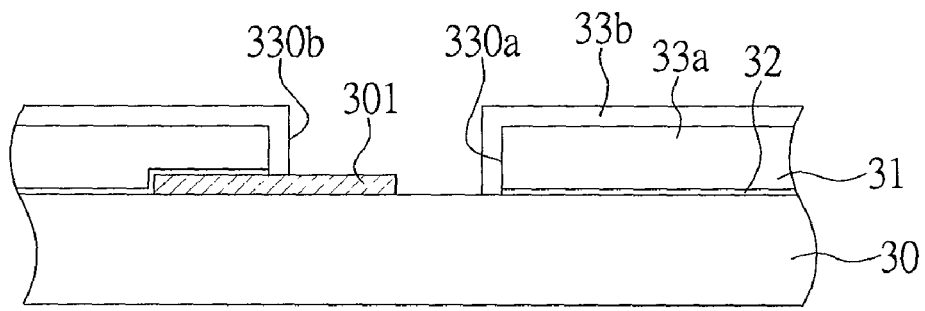
Figure 3F:
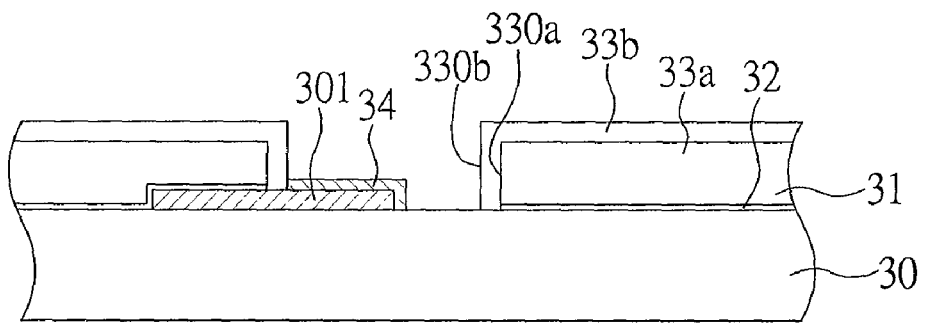
Figure 3G:
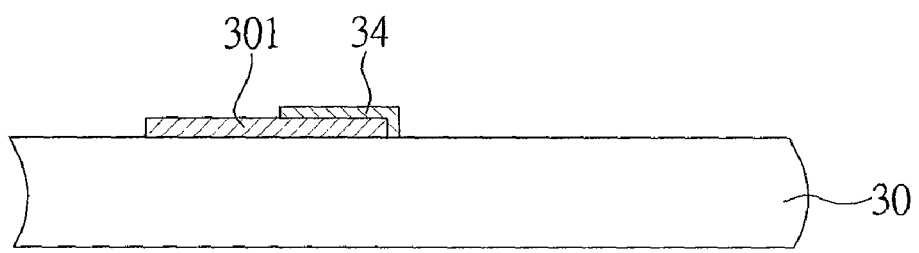
Figure 3H:
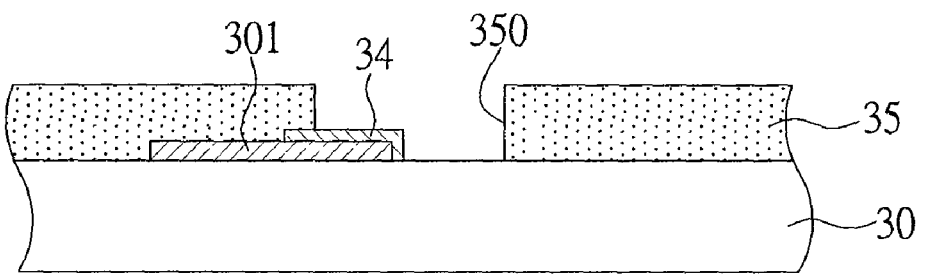
Figure 4A:
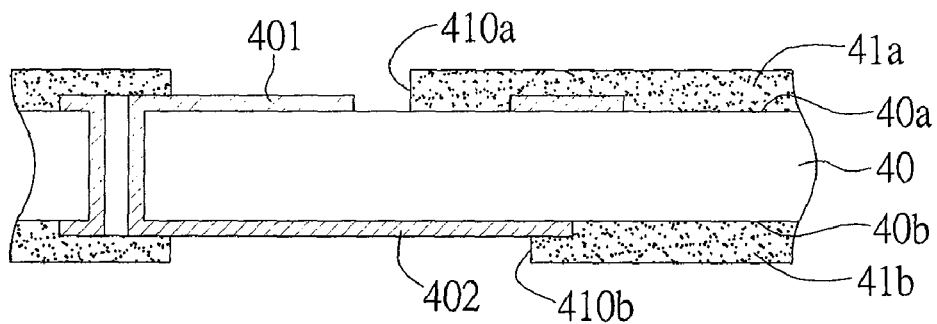
FIGS. 4A through 4G are cross-sectional views of the first embodiment of package substrate and a method for fabricating the same of the present invention.

As shown in FIG. 4A, provide a substrate body 40 with a die attaching side 40a and a ball implanting side 40b opposite each other, the die attaching side 40a and the ball implanting side 40b have a plurality of wire bonding pads 401 and a plurality of solder ball pads 402 respectively; form a first insulating passivation layer 41a and a second insulating passivation layer 41b on the die attaching side 40a and the ball implanting side 40b respectively, and then form a plurality of first apertures 410a and a plurality of second apertures 410b in the first insulating passivation layer 41a and the second insulating passivation layer 41b respectively to correspondingly expose the wire bonding pads and the solder ball pads. There are various related techniques for fabricating substrate bodies, the related techniques are well known by persons skilled in the art, and thus the related techniques are not regarded as features of present invention. Therefore, the related techniques do not deserve any detailed description herein.

Figure 4B:
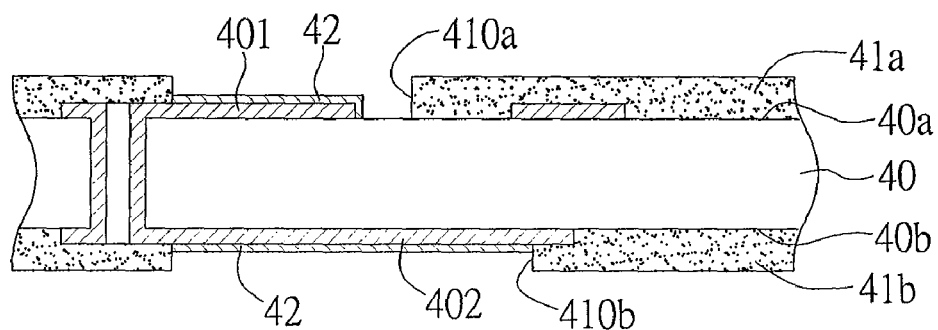

As shown in FIG. 4B, form a chemical plating metal layer 42 on surfaces of the wire bonding pads 401 and the solder ball pads 402 respectively; the chemical plating metal layer is made of either nickel/gold (Ni/Au) or nickel/palladium/gold (Ni/Pd/Au), and the gold is formed outermost.

Figure 4C:
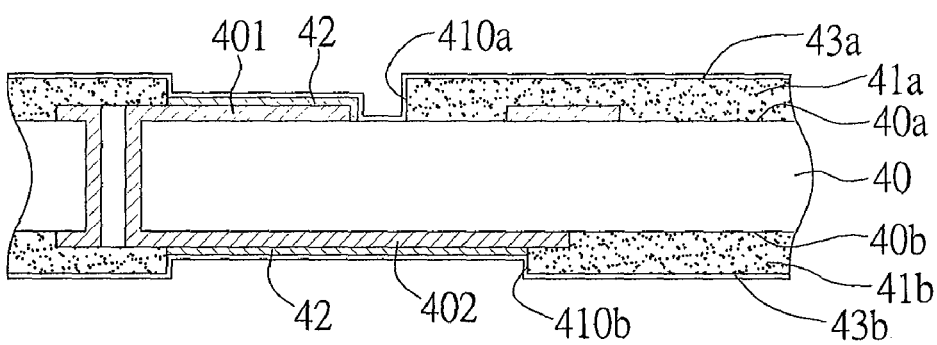
Figure 4C:
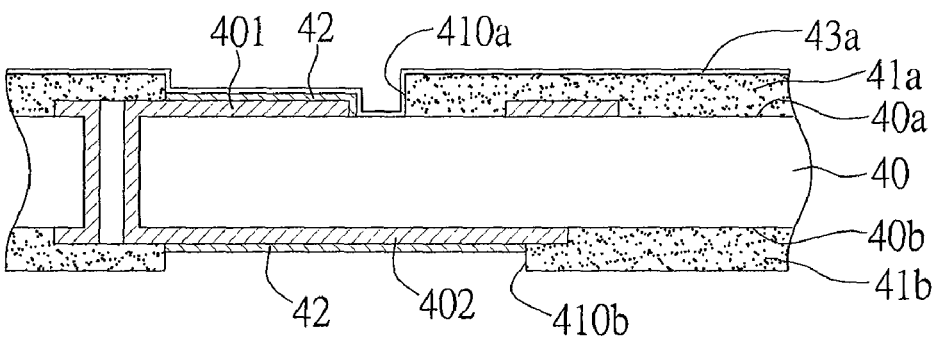

As shown in FIG. 4C, form a first conductive layer of copper (Cu) 43a on the first insulating passivation layer 41a and the chemical plating metal layer 42 of the wire bonding pads 401, and also form a second conductive layer 43b on the second insulating passivation layer 41b and the chemical plating metal layer 42 of the solder ball pads 402; or as shown in FIG. 4C', form a first conductive layer 43a on the first insulating passivation layer 41a and the chemical plating metal layer 42 of the wire bonding pads 401 only, no conductive layer is formed on the second insulation passivation layer 41b and the chemical plating metal layer 42 of the solder ball pads 402; the first and the second conductive layers 43a and 43b are formed by means of either chemical deposition or physical deposition.

Figure 4D:
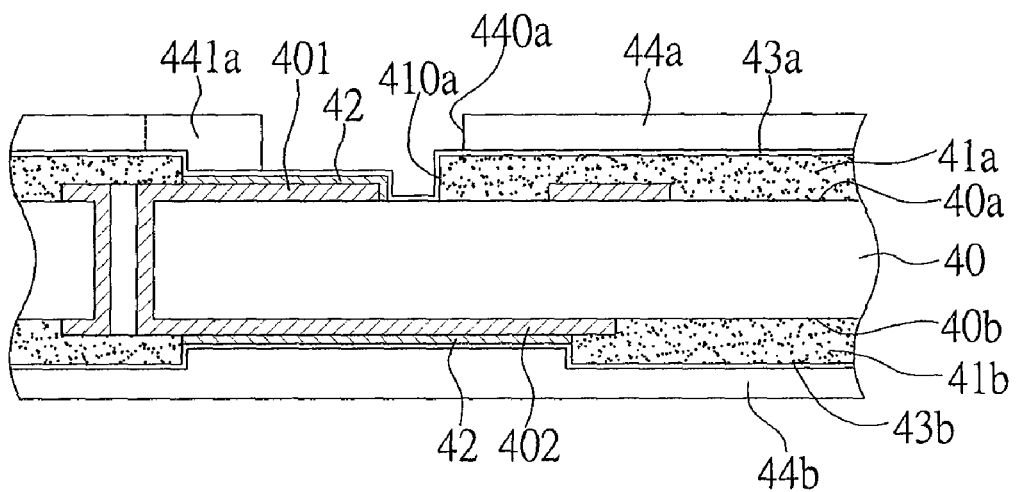
Figure 4D:
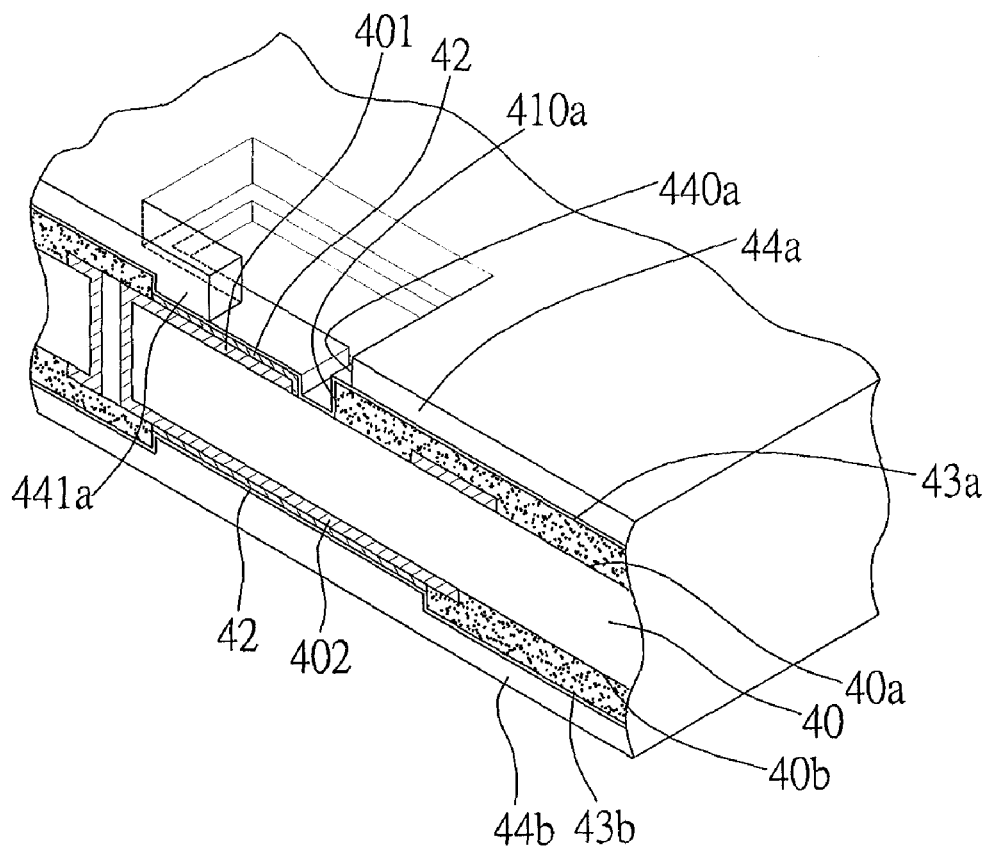

As shown in FIGS. 4D and 4D', wherein FIG. 4D' is a perspective cross-sectional view corresponding to FIG. 4D, form a first photoresist layer 44a on the first conductive layer 43a, and further form a plurality of first openings 440a in the first photoresist layer 44a on the die attaching side 40a of the substrate body 40 to expose the first conductive layer 43a on area around the wire bonding pads 401; the first openings 440a are larger than the first apertures 410a, and the first photoresist layer 44a has a extension 441a formed on each of the wire bonding pads 401 inside the first openings 440a to cover part of the first conductive layer 43a; form a second photoresist layer 44b on the second conductive layer 43b, in another situation as in accordance with structure illustrated in the aforesaid FIG. 4C', form a second photoresist layer 44b on the second insulating passivation layer 41b and the chemical plating metal layer 42 of the solder ball pads 402; the first and the second photoresist layers 44a and 44b can be photo photoresist, e.g. fry film, liquid photo photoresist, or others, which are formed on the first conductive layer 43a and the second conductive layer 43b by means of printing, spin coating, laminating, or others, and then form a plurality of first openings 440a in the first photoresist layer 44a through a patterning process of exposing, developing, etching and others to expose part surface of the first conductive layer 43a.

Figure 4E:
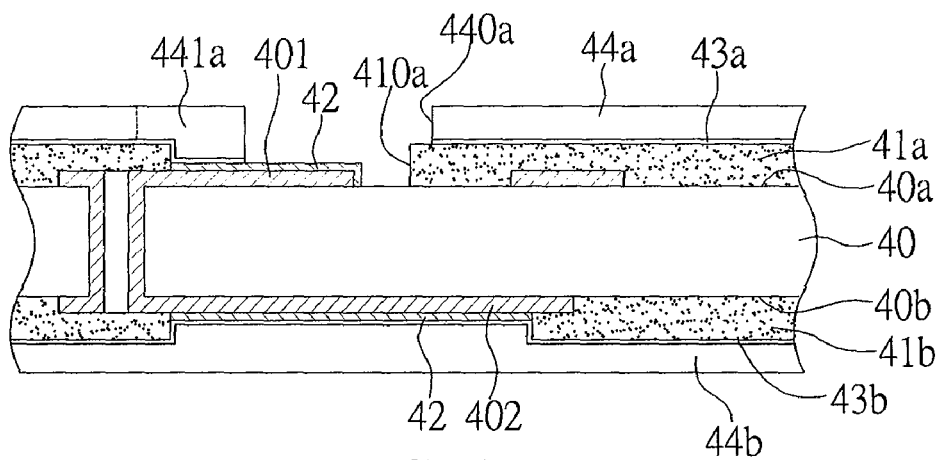

As shown in FIG. 4E, remove the first conductive layer 43a inside the first openings 440a to expose the chemical plating metal layer 42 of the wire bonding pads 401.

Figure 4F:
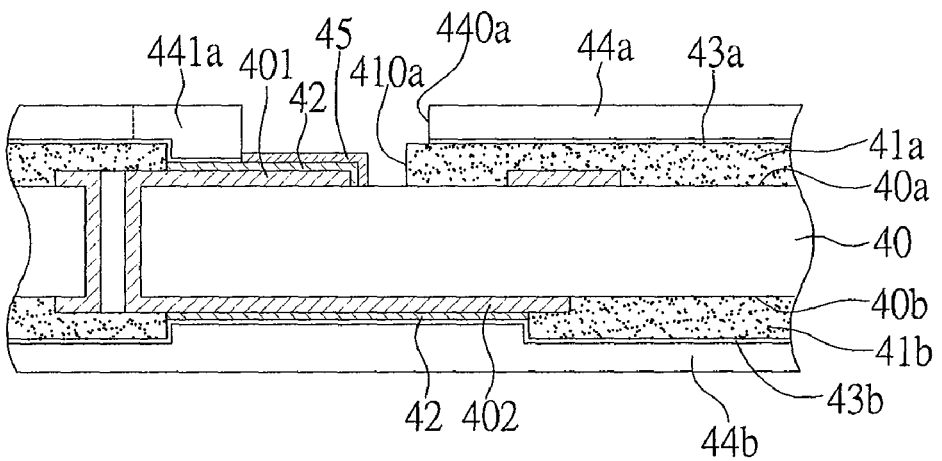

As shown in FIG. 4F, subsequently form a wire bonding metal layer of gold (Au) 45 on a surface of the chemical plating metal layer 42 of the wire bonding pads 401 by means of electroplating, thereby avoiding wiring process of plating lines and providing high density wiring and fine spacing between wire bonding pads; and since the wire bonding metal layer 45 is formed on the wire bonding pads after the chemical plating metal layer 42 being formed, thereby enhancing bonding capability and being advantageous to application demands of high number of pins with fine spacing.

Figure 4G:
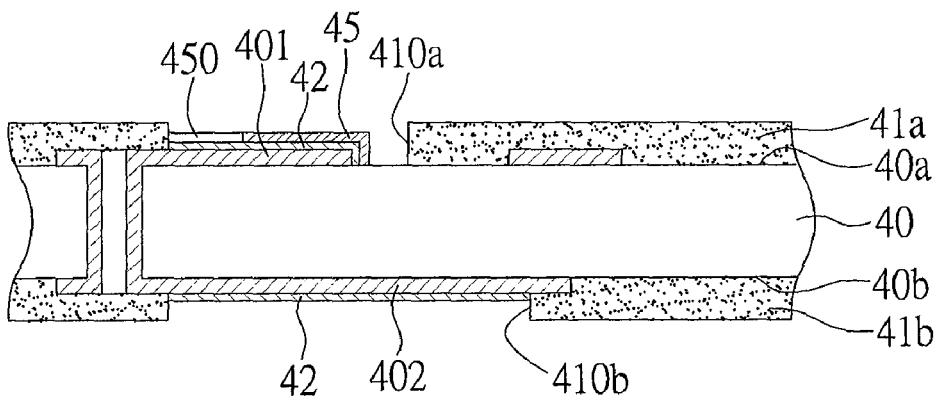
Figure 4G:
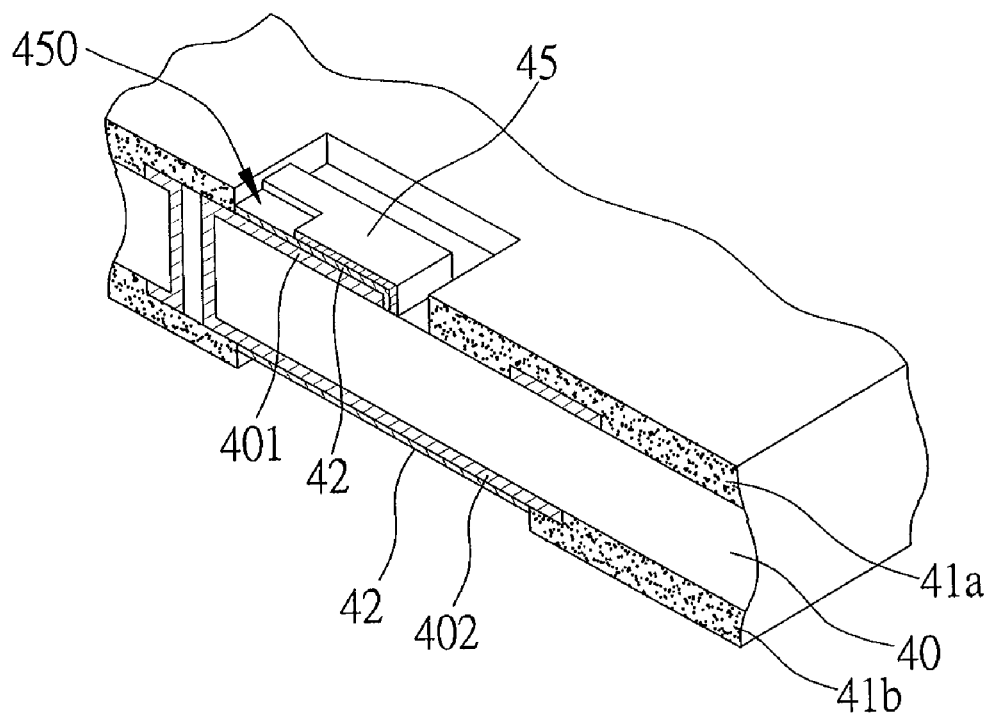
Figure 4G:
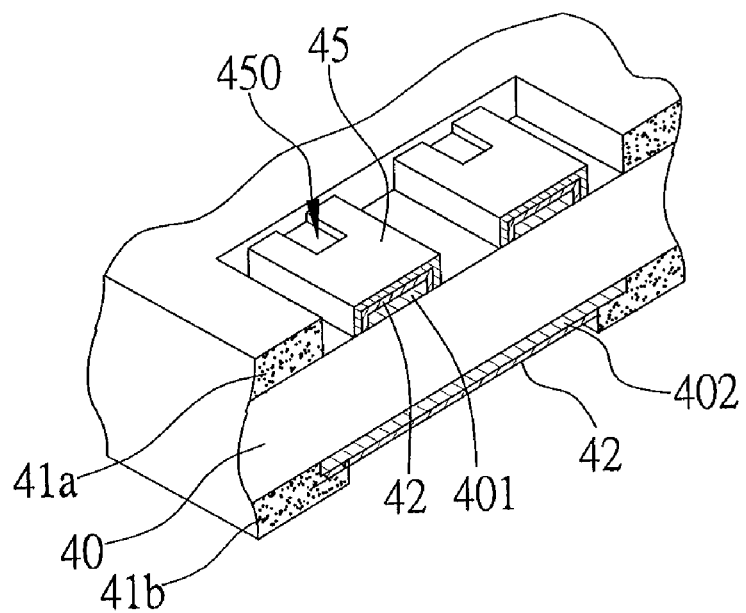

As shown in FIGS. 4G, 4G', and 4G", wherein FIGS. 4C' and 4C" are perspective cross-sectional views corresponding to FIG. 4G at different angles; at the end, remove the first photoresist layer 44a and the first conductive layer 43a covered thereunder to expose the first insulating passivation layer 41a and the wire bonding metal layer 45 on the wire bonding pads 401 inside the first apertures 410a, and also form a rectangular gap 450 on the wire bonding metal layer 45 near the first insulating passivation layer 41a above each of the wire bonding pads 401 to expose the chemical plating metal layer 42 of the wire bonding pads 401; remove the second photoresist layer 44b and the second conductive layer 43b, or, in accordance with structure illustrated by foregoing FIG. 4C', remove the second photoresist layer 44b only to consequently expose the second insulating passivation layer 41b and the chemical plating metal layer 42 of the solder ball pads 402.

Second Embodiment

Please refer to FIGS. 5A through 5E, which are cross-sectional views of the second embodiment of fabrication method of package substrate of the present invention.

Figure 5A:
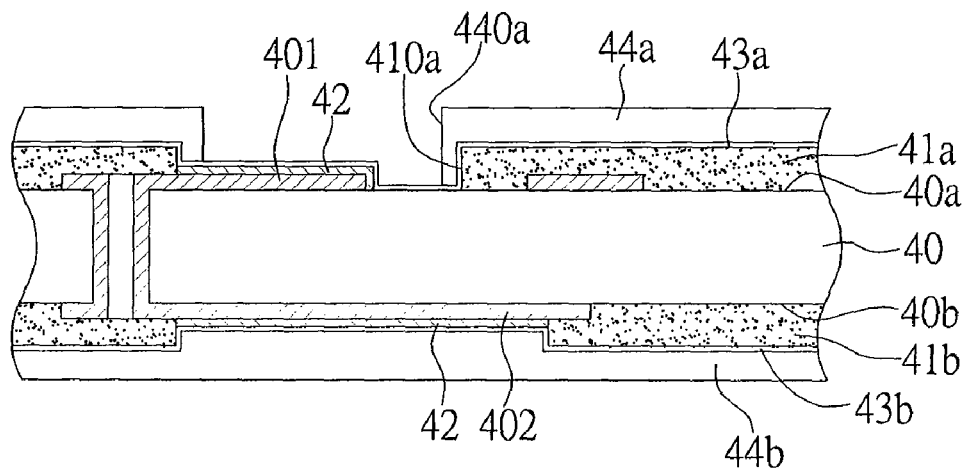
FIGS. 5A through 5E are cross-sectional views of the second embodiment of package substrate and a method for fabricating the same of the present invention.
Figure 5A:
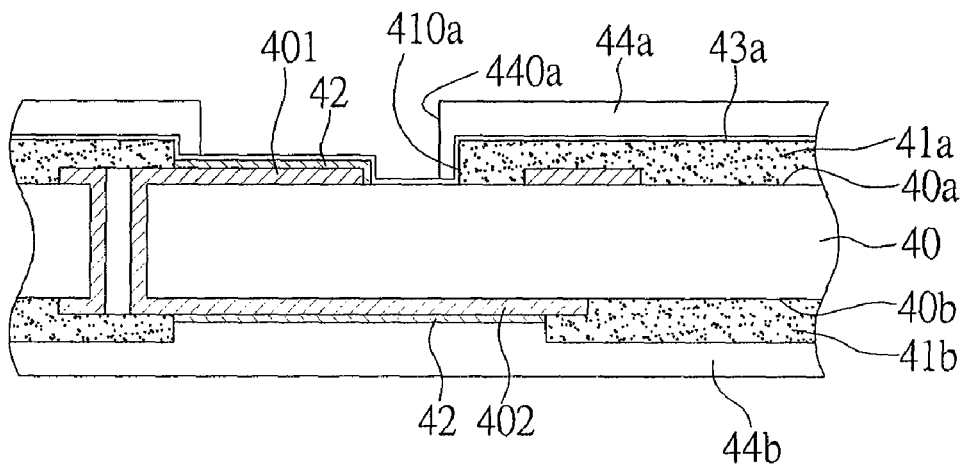

As shown in FIGS. 5A and 5A', provide first a structure as previously illustrated by FIG. 4C of the first embodiment, and then form a first photoresist layer 44a on the first conductive layer 43a, and also form a plurality of first openings 440a in the first photoresist layer 44a to correspondingly expose the first conductive layer 43a on area of the wire bonding pads 401, and the first openings 440a are smaller than the first apertures 410a of the first insulating passivation layer 41a to consequently cover part of the first conductive layer 43a on the wire bonding pads 401; and as shown in FIG. 5A, form a second photoresist layer 44b on the second conductive layer 43b, or, in accordance with structure illustrated by foregoing FIG. 4C', as shown in FIG. 5A', form a second photoresist layer 44b on the second insulating passivation layer 41b and the chemical plating metal layer 42 of the solder ball pads 402.

Figure 5B:
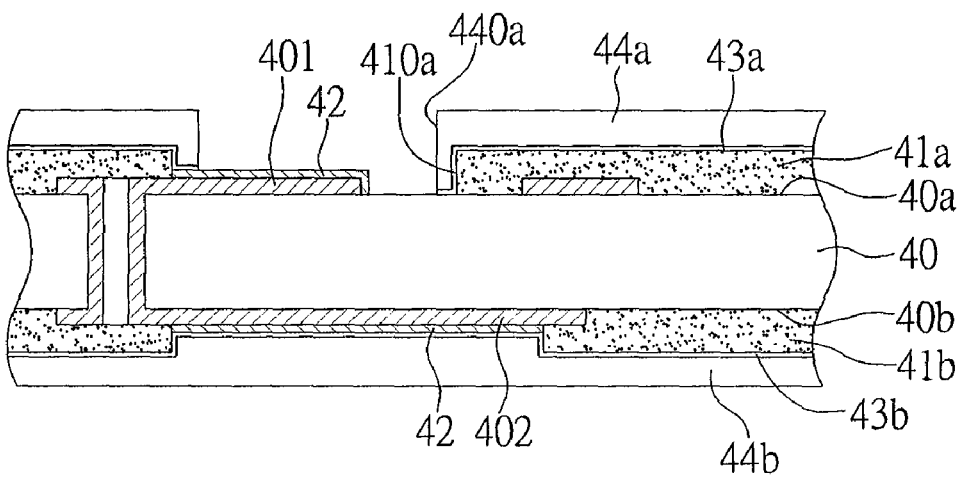

As shown in FIG. 5B, remove the first conductive layer 43a inside the first openings 440a to expose the chemical plating metal layer 42 of the wire bonding pads 401.

Figure 5C:
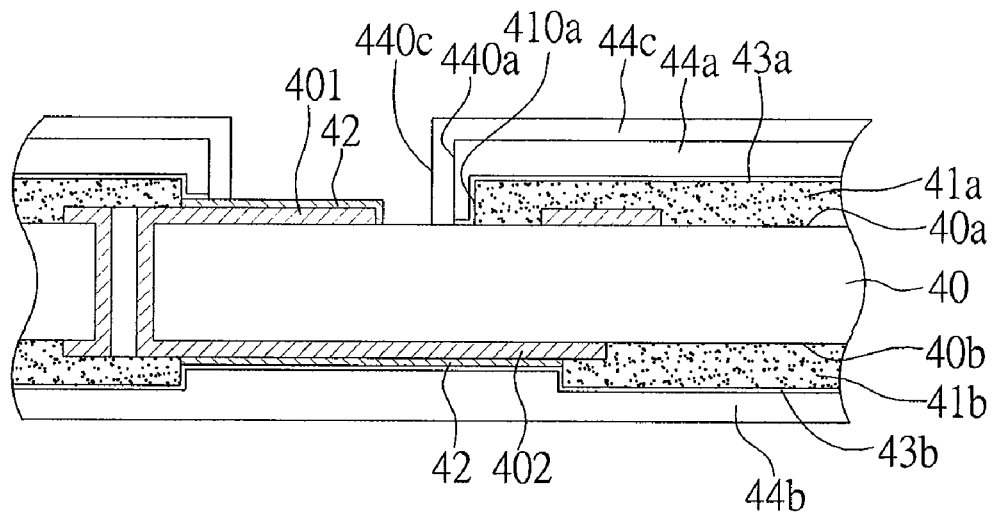
Figure 5C:
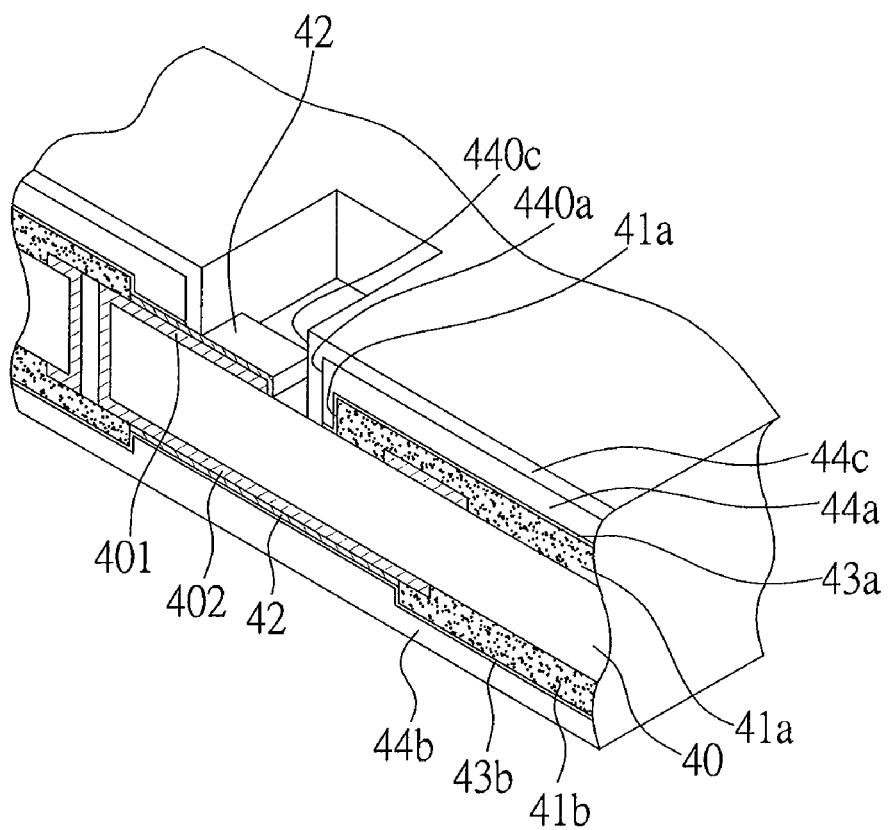

As shown in FIGS. 5C and 5C', wherein FIG. 5C' is a perspective cross-sectional view of FIG. 5C, form a third photoresist layer 44c on the first photoresist layer 44a, and then form a plurality of third openings 440c, which are smaller than the first openings 440a, on the third photoresist layer 44c to expose the chemical plating metal layer 42 of the wire bonding pads 401 but still cover part of the first conductive layer 43a exposed from the first photoresist layer 44a.

Figure 5D:
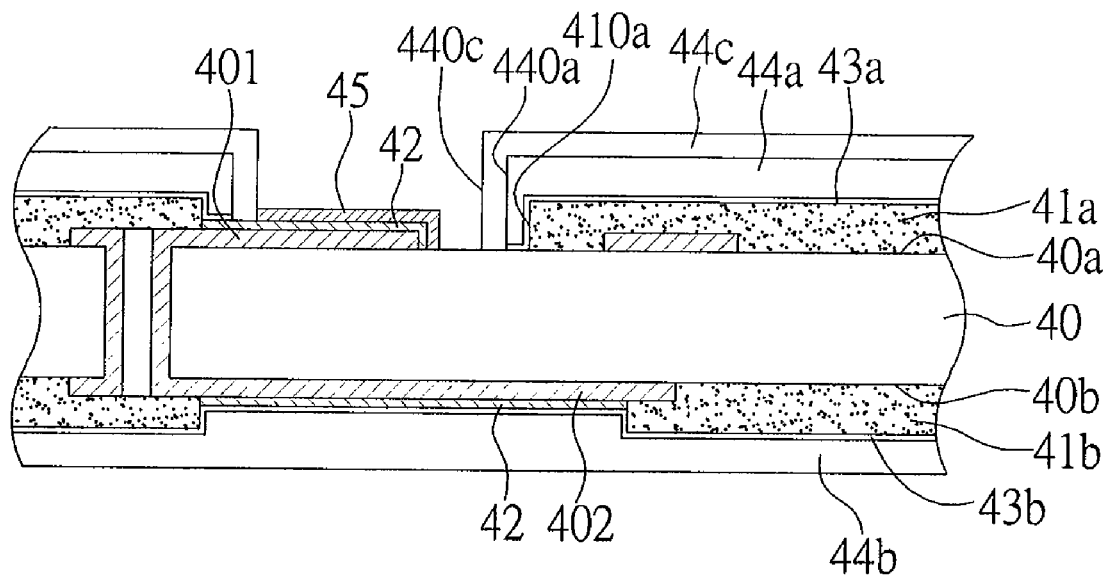

As shown in FIG. 5D, form a wire bonding metal layer 45 on a surface of the chemical plating metal layer 42 of the wire bonding pads 401 by means of electroplating.

Figure 5E:
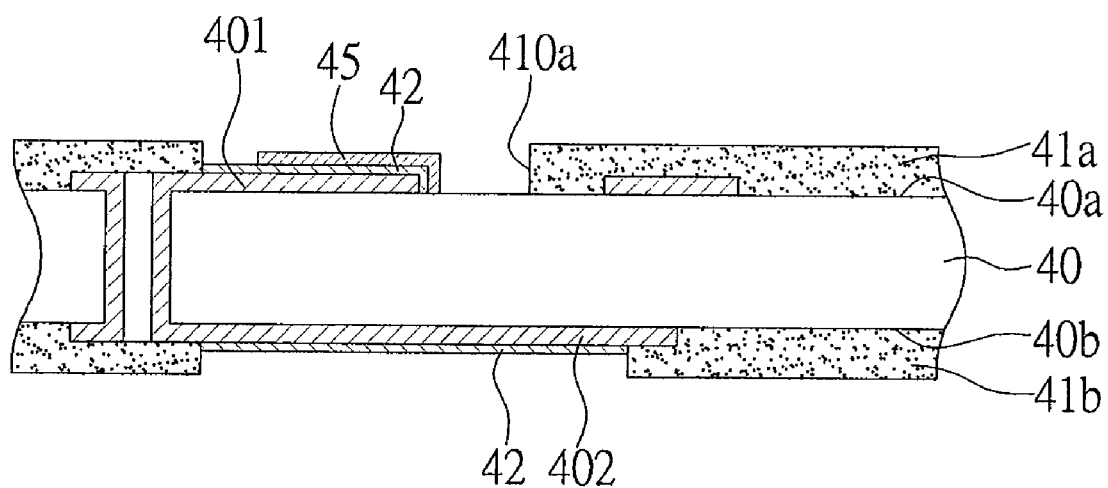

As shown in FIGS. 5E, 5E', and 5E", wherein FIGS. 5E' and 5E" are perspective cross-sectional views corresponding to FIG. 5E at different angles, at the end, remove the third photoresist layer 44c, the first photoresist layer 44a, and the first conductive layer 43a covered thereunder to expose the first insulating passivation layer 41a and the wire bonding metal layer 45 on the wire bonding pads 401 inside the first apertures 410a, and also form a gap 450' on the wire bonding metal layer 45 near the first insulating passivation layer 41a traversing each of the wire bonding pads 401 to expose the chemical plating metal layer 42; remove the second conductive layer 43b and the second photoresist layer 44b, or, in accordance with structure illustrated by foregoing FIG. 5A', remove the second photoresist layer 44b only to consequently expose the second insulating passivation layer 41b and the chemical metal layer 42 of the solder ball pads 402.

Third Embodiment

Please refer to FIGS. 6A through 6E, which are cross-sectional views of the third embodiment of fabrication method of package substrate of the present invention, a main difference between both foregoing embodiments is that plating lines 403 collectively function as an electrical conduction path to form a wire bonding metal layer on the wire bonding pads by means of electroplating.

Figure 6A:
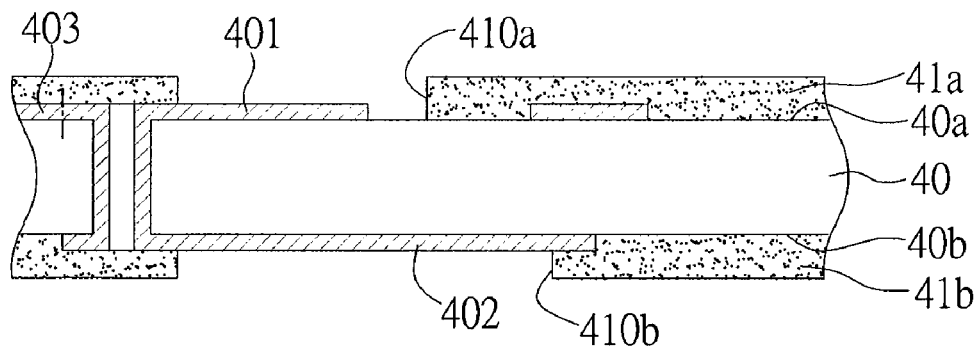
FIGS. 6A through 6E are cross-sectional views of the third embodiment of package substrate and a method for fabricating the same of the present invention.

As shown in FIG. 6A, provide a structure as illustrated in FIG. 4A of the first embodiment, wherein the wire bonding pads 401 are electrically connecting to the plating lines 403.

Figure 6B:
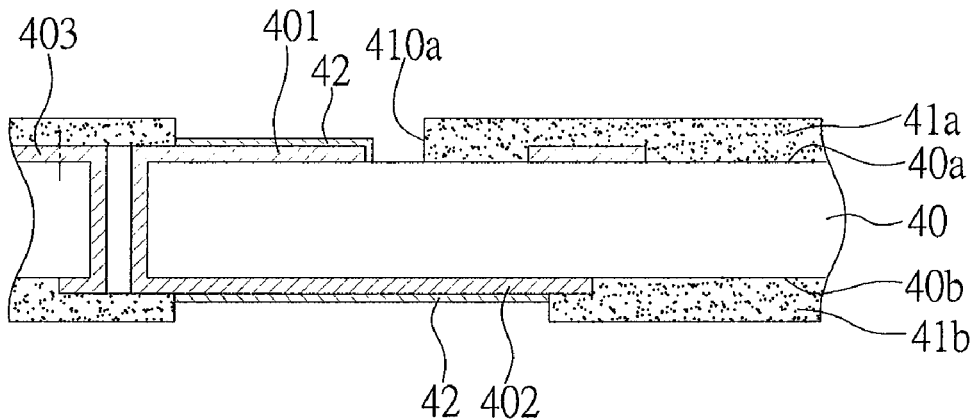

As shown in FIG. 6B, form a chemical plating metal layer 42 on the wire bonding pads 401 of the die attaching side 40a and the solder ball pads 402 of the ball implanting side 40b of the substrate body 40 respectively.

Figure 6C:
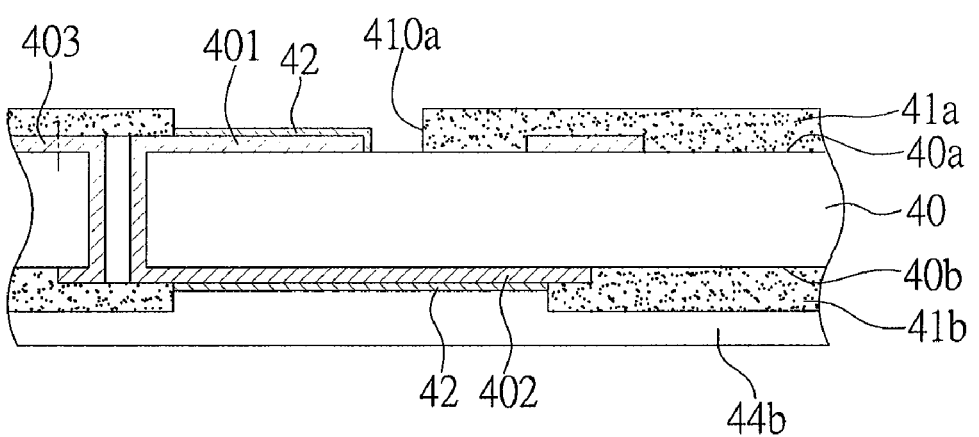

As shown in FIG. 6C, form a second photoresist layer 44b on the second insulating passivation layer 41b and the chemical plating metal layer 42 of the solder ball pads 402, but the first insulating passivation layer 41a has no photoresist layer formed thereon.

Figure 6D:
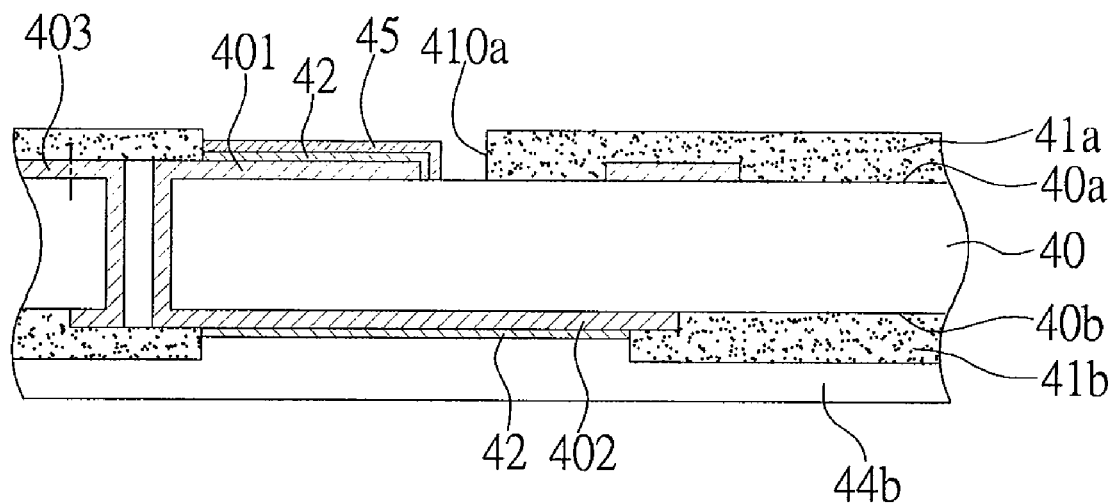

As shown in FIG. 6D, subsequently form a wire bonding metal layer of gold (Au) 45 on the chemical plating metal layer 42 of the wire bonding pads 401 by electroplating via the plating lines 403, and since the wire bonding metal layer 45 is formed on the wire bonding pads 401 after formation of the chemical plating metal layer 42, thereby enhancing bonding capability and facilitating application of a high pin number necessitated by fine spacing.

Figure 6E:
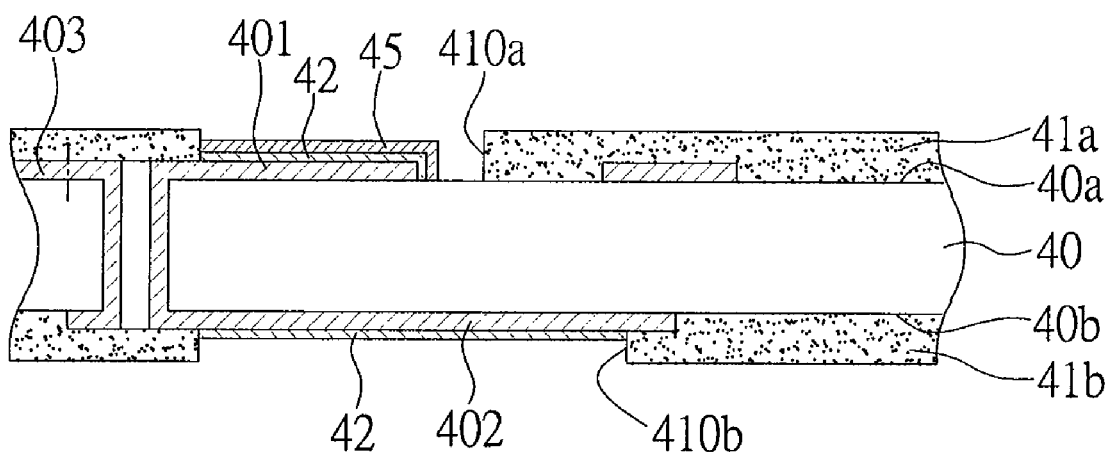

As shown in FIG. 6E, remove the second photoresist layer 44b to expose the second insulating passivation layer 41b and the chemical plating metal layer 42 of the solder ball pads 402.

The present invention further provides a package substrate comprising: a substrate body 40 with a die attaching side 40a and a ball implanting side 40b opposite each other, the die attaching side 40a and the ball implanting side 40b having a plurality of wire bonding pads 401 and a plurality of solder ball pads 402 respectively, the die attaching side 40a and the ball implanting side 40b having a first insulating passivation layer 41a and a second insulating passivation layer 41b respectively, the first insulating passivation layer 41a and the second insulation passivation layer 41b having a plurality of first apertures 410a and a plurality of second apertures 410b respectively to corresponding expose the wire bonding pads 401 and the solder ball pads 402; a chemical plating metal layer 42 formed on the wire bonding pads 401 and the solder ball pads 402 respectively; and a wire bonding metal layer 45 formed on the chemical plating metal layer 42 of the wire bonding pads 401.

The wire bonding pads 401 are electrically connected to plating lines 403. The chemical plating metal layer 42 is made of either nickel/gold (Ni/Au) or nickel/palladium/gold (Ni/Pd/Au); and the gold is formed outermost. The wire bonding metal layer 45 is a plating metal and is made of gold (Au).

The present invention provides a package substrate and a method for fabricating the same. A die attaching side and a ball implanting side of the package substrate are formed with a first insulating passivation layer and a second insulating passivation layer respectively. A chemical plating metal layer and a wire bonding metal layer implemented as a plating metal are formed on the wire bonding pads in sequence. Hence, the thickness of the chemical plating metal layer and the wire bonding metal layer is relatively great, compared to the thickness obtained by performing chemical plating to solder ball pads. Also, the plating metal of the present invention is harder than it would be when performing chemical plating to solder ball pads. Hence, the present invention features enhanced bonding capability in an ensuing wire bonding process. Last but not least, the present invention spares the need for a wiring process of plating lines and thereby provides high density wiring and fine spacing The foregoing descriptions of the detailed embodiments are only illustrated to disclose the features and functions of the present invention and not restrictive of the scope of the present invention. It should be understood by persons skilled in the art that all modifications and variations made according to the spirit and principle in the disclosure of the present invention should fall within the scope of the appended claims.

What is claimed is:

1. A fabrication method of a package substrate, comprising the steps of:

a substrate body having a die attaching side and a ball implanting side opposite to the die attaching side, wherein the die attaching side is formed with a plurality of wire bonding pads, and is covered with a first insulating passivation layer being formed with a plurality of first apertures for exposing the wire bonding pads, and wherein the ball implanting side is formed with a plurality of solder ball pads and is covered with a second insulating passivation layer being formed with a plurality of second apertures for exposing the solder ball pads;

forming a chemical plating metal layer on the wire bonding pads and the solder ball pads respectively;

forming a first conductive layer on the first insulating passivation layer and the chemical plating metal layer on the wire bonding pads;

forming a first photoresist layer on the first conductive layer, and forming a plurality of first openings in the first photoresist layer to expose the first conductive layer corresponding in position to the wire bonding pads, wherein the first openings are smaller in diameter than the first apertures so that a part of the first conductive layer on the wire bonding pads is covered by the first photoresist layer;

removing the first conductive layer exposed from the first openings to expose the chemical plating metal layer on the wire bonding pads;

forming a third photoresist layer on the first photoresist layer, and forming in the third photoresist layer a plurality of third openings smaller in diameter than the first openings so as to expose the chemical plating metal layer on the wire bonding pads;

forming a wire bonding metal layer on the chemical plating metal layer on the wire bonding pads by electroplating; and removing the third photoresist layer, the first photoresist layer, and the first conductive layer under the first photoresist layer so as to expose the first insulation passivation layer and the wire bonding metal layer on the wire bonding pads inside the first apertures.

2. The fabrication method of a package substrate of claim 1, wherein the chemical plating metal layer is made of a material selected from the group consisting of nickel/gold (Ni/Au) and nickel/palladium/gold (Ni/Pd/Au), the gold being formed outermost.

3. The fabrication method of a package substrate of claim 1, further comprising the step of forming a second conductive layer on the second insulating passivation layer and the chemical plating metal layer on the solder ball pads.

4. The fabrication method of a package substrate of claim 1, wherein the conductive layer is formed by one of chemical deposition and physical deposition.

5. The fabrication method of a package substrate of claim 1, wherein the first conductive layer is made of copper (Cu).

6. The fabrication method of a package substrate of claim 1, wherein the wire bonding metal layer is made of gold (Au).

* * * * *